US010832742B2

(12) United States Patent
Ota et al.

(10) Patent No.: US 10,832,742 B2
(45) Date of Patent: Nov. 10, 2020

(54) SEMICONDUCTOR STORAGE DEVICE

(71) Applicant: TOSHIBA MEMORY CORPORATION, Tokyo (JP)

(72) Inventors: Kensuke Ota, Yokohama Kanagawa (JP); Masumi Saitoh, Yokohama Kanagawa (JP); Kiwamu Sakuma, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/549,844

(22) Filed: Aug. 23, 2019

(65) Prior Publication Data
US 2020/0265872 A1 Aug. 20, 2020

(30) Foreign Application Priority Data
Feb. 15, 2019 (JP) .................................. 2019-025690

(51) Int. Cl.
G11C 5/06 (2006.01)
H01L 27/24 (2006.01)
H01L 45/00 (2006.01)

(52) U.S. Cl.
CPC .......... *G11C 5/063* (2013.01); *H01L 27/2436* (2013.01); *H01L 27/2481* (2013.01); *H01L 45/1616* (2013.01); *H01L 45/1675* (2013.01)

(58) Field of Classification Search
CPC ............. H01L 27/2454; H01L 27/2472; H01L 27/2481; H01L 45/122; H01L 45/1233; H01L 45/1253
See application file for complete search history.

(56) References Cited

U.S. PATENT DOCUMENTS

| 8,742,389 | B2 | 6/2014 | Lee |
| 9,246,088 | B2 * | 1/2016 | Yamato ............... H01L 45/1226 |
| 9,257,484 | B2 | 2/2016 | Okajima |
| 2009/0134431 | A1 | 5/2009 | Tabata et al. |
| 2017/0271581 | A1 * | 9/2017 | Seong ................. H01L 45/1675 |

FOREIGN PATENT DOCUMENTS

JP 6045983 B2 12/2016

* cited by examiner

*Primary Examiner* — Allison Bernstein
(74) *Attorney, Agent, or Firm* — Kim & Stewart LLP

(57) ABSTRACT

A semiconductor storage device includes a first wire extending in a first direction from a first end to a second end, a plurality of second wires spaced from each other in the first direction and extending in a second direction intersecting the first direction, and a plurality of memory films spaced from each other along the first wire from the first end to the second end and respectively being between the first wire and a second wire of the plurality of second wires. A first memory film of the plurality is at position along the first wire that is between a position of a second memory film and the first end. A contact area between the second memory film and the first wire is greater than a contact area between the first memory film and the first wire.

20 Claims, 14 Drawing Sheets

SEMICONDUCTOR STORAGE DEVICE

CROSS-REFERENCE TO RELATED APPLICATION

This application is based upon and claims the benefit of priority from Japanese Patent Application No. 2019-025690, filed Feb. 15, 2019, the entire contents of which are incorporated herein by reference.

FIELD

Embodiments described herein relate generally to a semiconductor storage device.

BACKGROUND

A resistance-change type semiconductor storage device stores information by changing a resistance value of a memory film is known as a semiconductor storage device for storing large capacity data. The memory film used in this type of the semiconductor storage device changes the resistance value when a voltage is applied across the memory film.

DETAILED DESCRIPTION

According to one embodiment, a semiconductor storage device includes a first wire extending in a first direction from a first end to a second end, a plurality of second wires spaced from each other in the first direction and extending in a second direction intersecting the first direction, and a plurality of memory films spaced from each other along the first wire from the first end to the second end and respectively being between the first wire and a second wire of the plurality of second wires. The plurality of memory films includes a first memory film and a second memory film. The first memory film is at position along the first wire that is between a position of the second memory film and the first end. A contact area between the second memory film and the first wire is greater than a contact area between the first memory film and the first wire.

Hereinafter, a semiconductor storage device according to example embodiments will be described with reference to the drawings. The following embodiments are merely examples and are not intended to limit the present disclosure.

First Embodiment

Figure 1:
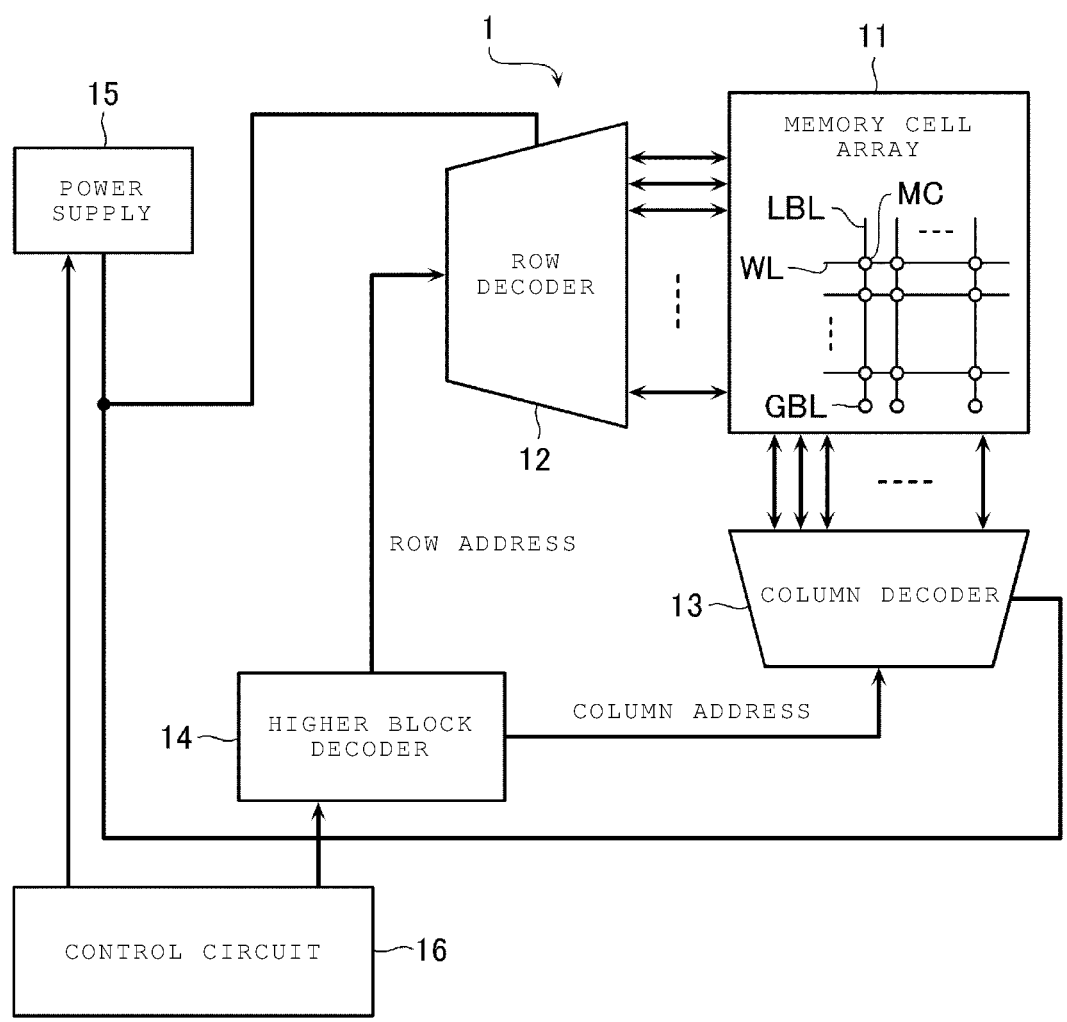
FIG. 1 is a block diagram of a semiconductor storage device according to a first embodiment.

FIG. 1 is a block diagram of a semiconductor storage device according to a first embodiment.

A semiconductor storage device 1 includes a memory cell array 11, a row decoder 12, a column decoder 13, a higher block decoder 14, which provides row and column addresses to the decoders 12 and 13, a power supply 15, which supplies power to each unit of the semiconductor storage device 1, and a control circuit 16 which controls these units. The row decoder 12 and the column decoder 13 together select a target memory cell MC in the memory cell array 11.

The memory cell array 11 includes a plurality of memory cells MC each of which storing one bit or a plurality of bits of data. The memory cell array 11 accesses (erase, write, and read) data to a particular memory cell MC by applying a predetermined voltage to a desired global bit line GBL and a word line WL which are selected by the row decoder 12 and column decoder 13.

The row decoder 12 selects a word line WL according to the row address and applies a predetermined voltage to the selected word line WL at the time of accessing data. The column decoder 13 selects one or a plurality of global bit lines GBL depending on the column address and applies a predetermined voltage to selected global bit lines GBL at the time of accessing data. The column decoder 13 further includes a sense amplifier circuit and determines data recorded in the memory cell MC by detecting a current or a voltage on the global bit line GBL. The higher block decoder 14 generates the row and column addresses depending on address data and supplies the row and column addresses to the row decoder 12 and the column decoder 13. The power supply 15 generates predetermined voltages corresponding to each of the erase, write, and read operations, and supplies the voltages to the row decoder 12 and the column decoder 13. The control circuit 16 receives an external control signal from an external host or the like and controls the higher block decoder 14 and power supply 15.

Figure 2:
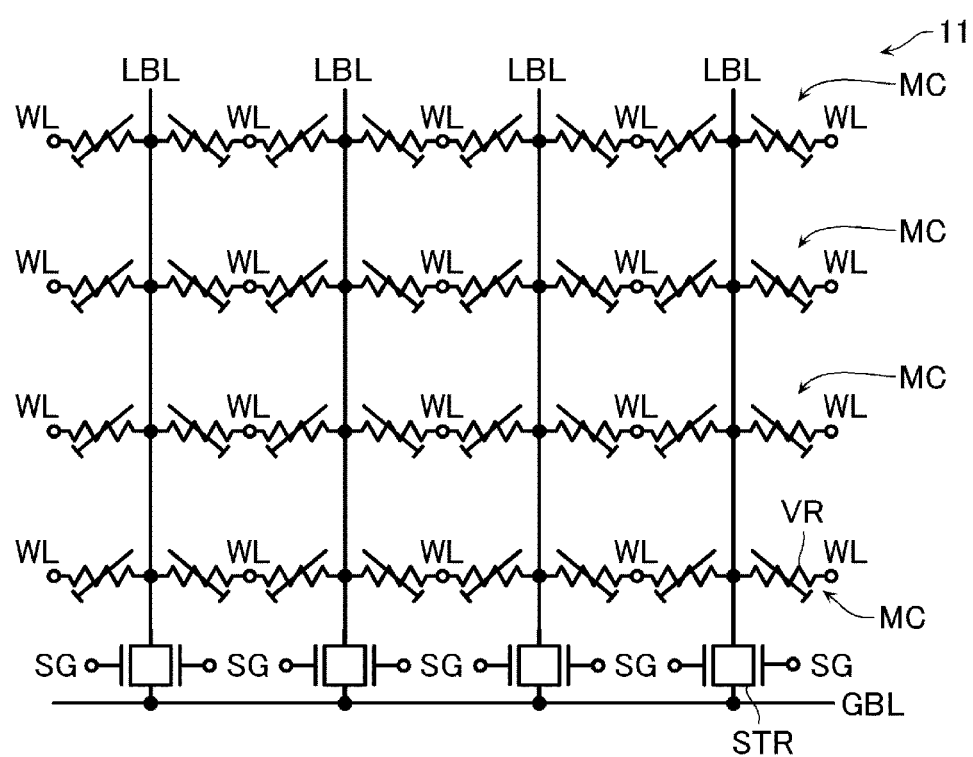
FIG. 2 is an equivalent circuit diagram of a memory cell array in a semiconductor storage device.

FIG. 2 is an equivalent circuit diagram of memory cell array 11.

The memory cell array 11 includes a plurality of word lines WL, a plurality of local bit lines LBL, and memory cells MC connected between the word lines WL and the local bit lines LBL. The memory cell array 11 further includes global bit lines GBL and selection gate transistors STR. The selection gate transistors STR are connected between the global bit lines GBL and the local bit lines LBL. A select gate line SG is connected to a gate electrode of the selection gate transistor STR.

These memory cells MC include a variable resistance element VR. For example, when the variable resistance element VR is in a low resistance state, the memory cell MC stores a data value of "1", and when the variable resistance element VR is in a high resistance state, the memory cell MC stores a data value of "0".

Figure 3:
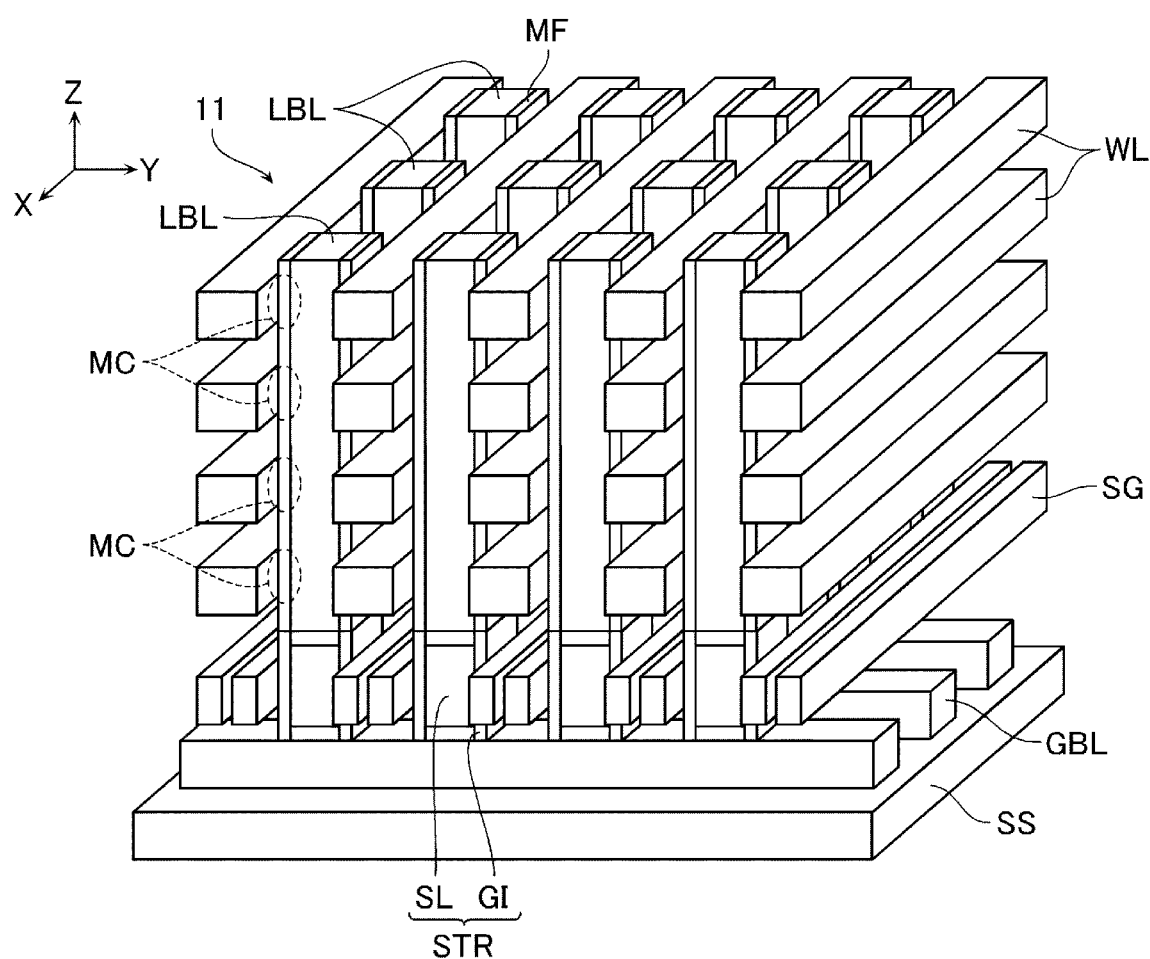
FIG. 3 is a perspective view illustrating a memory cell array.

FIG. 3 is a perspective view schematically illustrating a configuration of a part of the memory cell array 11. FIG. 3 depicts a three-dimensional structure including wiring layers and memory cells MC. An interlayer insulating film is typically provided between these wirings and memory cells MC but is not specifically illustrated in FIG. 3 for explanatory convenience. FIG. 3 schematically illustrates a configuration of a part of the memory cell MC and the specific details of the configuration depicted, such various dimensions such as thicknesses, widths, and likewise a ratio of dimensions between elements may be different from actual devices.

In the following descriptions, a direction orthogonal to a surface of a substrate is referred to as a Z direction, a direction parallel to the surface of the substrate is referred to as an X direction, and a direction parallel to the surface of the substrate and intersecting the X direction is referred to as a Y direction. In addition, a direction away from the surface of the substrate along the Z direction is referred to as "up", and a direction towards the substrate along the Z direction is referred to as "down". In addition, a surface facing the X direction or the Y direction may be referred to as a side surface.

The memory cell array 11 has a virtual bit line (VBL) structure. The word lines WL, the local bit lines LBL, the memory cells MC, the global bit lines GBL, the selection gate transistors STR, and the select gate lines SG are provided on an upper surface of a substrate SS.

The substrate SS is, for example, a semiconductor substrate formed of a semiconductor material such as silicon. An upper surface of the substrate SS is, for example, a plane extending in the X direction and the Y direction.

The plurality of word lines WL are arranged in the Y direction and the Z direction and extend in the X direction. The word line WL is formed of a conductive material such as tungsten (W) or the like.

The plurality of local bit lines LBL (are arranged in the X direction and the Y direction and extend in the Z direction. The local bit line LBL is formed of a conductive material such as tungsten (W) or the like.

The memory cell MC is formed of memory films MF. The memory film MF according to the present embodiment extends in the Z direction along a side surface of the local bit line LBL and is between the local bit line LBL and the plurality of word lines WL in the Y direction. The portions indicated by the broken line in FIG. 3 of the memory film MF which are disposed between a word line WL and a local bit line LBL form a memory cell MC.

Lower ends of local bit lines LBL aligned in the Y direction are connected to a common global bit line GBL via the selection gate transistors STR. The plurality of the global bit lines GBL are arranged in the X direction and extend in the Y direction. The global bit lines GBL are formed of a conductive material such as tungsten (W) or the like.

The plurality of selection gate transistors STR are arranged in the X direction and the Y direction. The selection gate transistor STR includes a semiconductor layer SL, agate insulating film GI provided on a side surface of the semiconductor layer SL in the Y direction. A lower end of each semiconductor layer SL is connected to a global bit line GBL.

An upper end of each semiconductor layer SL is connected to the lower end of a local bit line LBL. In addition, a pair of the select gate lines SG face each other through the gate insulating film GI on both side surfaces of the semiconductor layer SL in the Y direction.

The plurality of select gate lines SG are arranged in the Y direction and extend in the X direction. Two select gate lines SG are provided between a pair of the selection gate transistors STR adjacent to each other in the Y direction.

The memory film MF is, for example, a resistance change film which changes resistance value according to whether a set voltage and a reset voltage was last applied. In this context, a resistance change material may be a PCMO material, an amorphous Si/TiO$_2$ material, or the like. In this context, a "PCMO material" is considered to be a material represented by the formula $Z_{x1}Ca_{1-x1}MnO_3$ (0<x1<1), where Z includes an element selected from the group of elements consisting of Pr, La, Gd, Ce, Pm, Sm, Eu, Td, Dy, Ho, Er, Yb, and Lu, or combinations thereof. An "amorphous Si/TiO$_2$ material" includes in this context, a material selected from the group consisting of amorphous silicon, amorphous silicon germanium, amorphous germanium, aluminum oxide, silicon oxide, and hafnium oxide with a material selected from the group consisting of titanium oxide, titanium oxynitride, tantalum oxide, and tungsten oxide, or combinations thereof.

Figure 4:
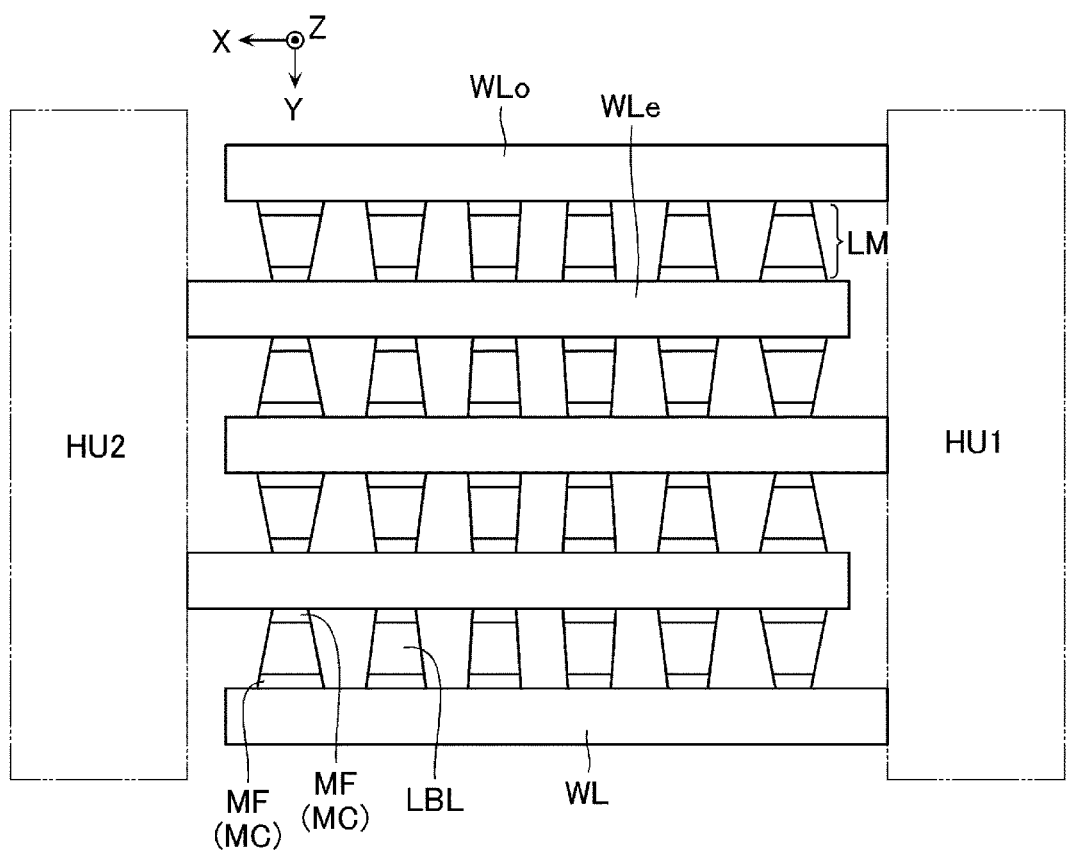
FIG. 4 is a plan view of a memory cell array.

FIG. 4 is a plan view illustrating a configuration of a portion of the memory cell array 11.

As illustrated in FIG. 4, word lines WLo are odd number word lines in the plurality of word lines WL with one end thereof in the X direction connected to a first hook-up portion HU1. Word lines WLe are even number word lines in the plurality of word lines WL with one end thereof in the X direction connected to a second hook-up portion HU2. That is, the word lines WLo and WLe are formed in interdigitated comb shapes facing each other. The first hook-up portion HU1 serves as a first voltage supply side supplying a set voltage, a reset voltage, or a read voltage to the memory cells MC) arranged between an odd-numbered word line WLo and a local bit line LBL. The second hook-up portion HU2 serves as a second voltage supply side supplying a set voltage, a reset voltage, or a read voltage to the memory cells MC arranged between an even-numbered word line WLe and a local bit line LBL.

The memory cells MC between the odd-numbered word lines WLo and a local bit line LBL constitute the memory cells MC of a first group, and the memory cell MC between the even-numbered word lines WLe and a local bit line LBL constitutes the memory cells MC of a second group.

The connection area between the odd-numbered word line WLo and each memory cell MC of the first group along the X-direction is increased as distance of the memory cell from the first hook-up portion HU1 increases. Likewise, the connection area between the even-number word line WLe and each memory cell MC of the second group along the X-direction increases as the distance of the memory cell MC from the second hook-up portion HU2 increases. In this example, the cross-sections viewed from the Z direction of a stacked body LM between uppermost odd-numbered word line WLo and uppermost even-numbered word line WLe change from one of a trapezoidal shape or reversed trapezoidal shape to the opposite. That is, from a trapezoidal shape to a reversed trapezoidal shape or from a reverse trapezoidal shape to a trapezoidal shape, respectively.

Figure 5A:
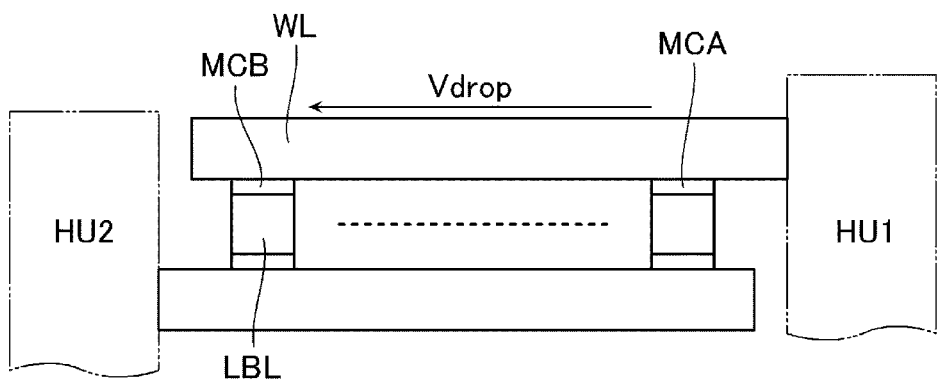
FIGS. 5A and 5B are views illustrating aspects of a semiconductor storage device.

Next, an operation of the semiconductor storage device according to the present embodiment will be described with reference to FIGS. 5A and 5B.

The memory cell MC changes to a set state of low resistance value when a set voltage Vset is applied and changes to a reset state of high resistance value when a reset voltage Vreset is applied. At the time of reading, a read voltage Vread, which is lower than the set voltage Vset and the reset voltage Vreset, is applied to the memory cell MC to measure a value of a read current. Since an on-current Ion flowing when the memory cell MC is in the set state has a current value larger than that of an off-current Ioff flowing when the memory cell MC is in the reset state, stored data is determined by identifying a level of the current value.

When a resistance-change type memory cell MC has current-voltage characteristics that fluctuate due to a magnitude of the set voltage Vset that has been used, a magnitude of the on-current Ion at the time of applying the read voltage varies depending on the magnitude of the set voltage Vset used at the time of setting the memory cell MC. This also causes on-current variation depending on a position of the memory cell MC. For example, when the set voltage Vset is supplied from the first hook-up portion HU1 to a memory cell MC, as illustrated in FIG. 5A, a set voltage Vsetb (see FIG. 5B) is applied to a memory cell MCB that is far away from the first hook-up portion HU1 due to voltage drop Vdrop. Thus, set voltage Vsetb is smaller than a set voltage Vseta (see FIG. 5B) applied to a memory cell MCA close to the first hook-up portion HU1. The voltage drop Vdrop is the difference between the set voltage Vseta and the set voltage Vsetb and is due to a resistance value of the word line WL. Generally, the difference in current value is largest during a set operation when the voltage drop is greatest.

Figure 5B:
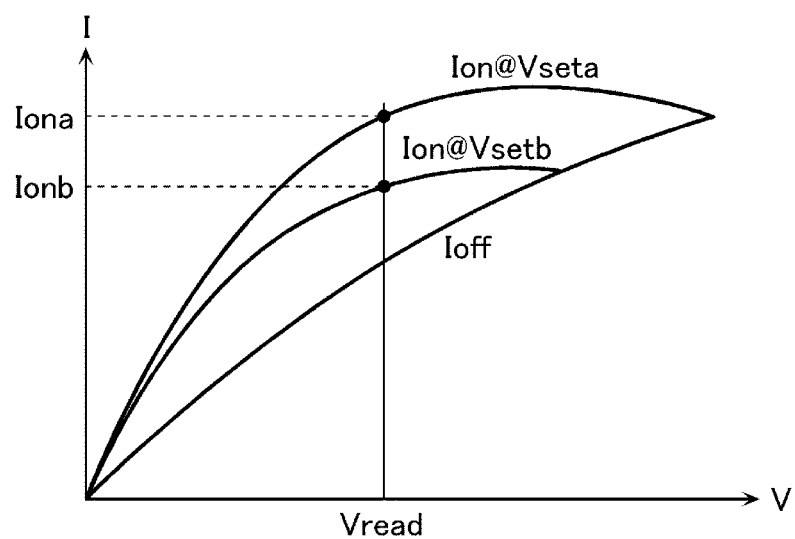

FIG. 5B illustrates an on-current-voltage characteristic Ion@Vseta of the memory cell MCA in which the set voltage is Vseta and an on-current-voltage characteristic Ion@Vsetb of the memory cell MCB in which the set voltage is Vsetb. Different on-currents Iona and Ionb flowing when the read voltage Vread is applied to memory cells MCA and MCB may result in reading errors.

In the semiconductor storage device according to the first embodiment, the difference between the on-currents is offset by adjusting the connection area between the memory cell MC and the word line WL. In particular, a connection area between the memory cell MCB and the word line WL is set to be n times a connection area between the memory cell MCA and the word line WL when the on-current Iona is n times the on-current Ionb. By doing so, the difference between the on-current Ionb flowing in the memory cell MCB and the on-current Iona flowing in the memory cell MCA is small, and thus the reading errors are reduced.

The optimal connection area between each memory cell MC and each word line WL can be calculated according to a magnitude of the voltage drop Vdrop from the hook-up portions HU1 and HU2 and on-current-voltage characteristics of the memory cell MC.

Figure 6:
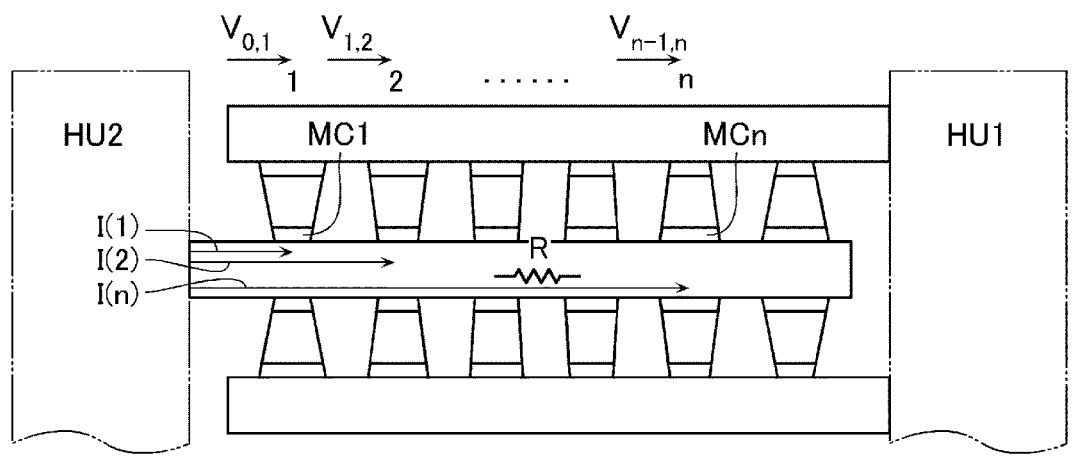
FIG. 6 is a view illustrating aspects of a semiconductor storage device.

For example, as illustrated in FIG. 6, the voltage drop Vdrop from the second hook-up portion HU2 to the memory cell MCn at the time of setting an n-th memory cell MCn is obtained as follows:

$$V\text{drop} = V_{0,1} + V_{1,2} + \ldots + V_{n-1,n},$$

Where, $V_{0,1}$ is a voltage drop from the second hook-up portion HU2 to a memory cell MC1, $V_{1,2}$ is a voltage drop from the memory cell MC1 to a memory cell MC2, and $V_{n-1,n}$ is a voltage drop from a memory cell MCn–1 to the memory cell MCn.

When the set voltage Vset is applied to the selected memory cells MCn, a voltage Vset/2 is applied to non-selected memory cells MC1 to MCn–1. Therefore, if an on-current flowing in the selected memory cells MCn is defined as Ion@Vset, the on-current Ion(k)@Vset/2 flows in non-selected k-th (k=1 to n–1) memory cells MCk when the selected memory cells MCn are set. However, when the selected memory cells MCn are set, the k-th memory cell MCk is not always itself in the set state. Therefore, a current I(k) flowing in the non-selected memory cell MCk is defined as Ion(k)@Vset/2/2 with the probability that the k-th memory cell MCk is itself in the set state being one-half. Since the voltage drop $V_{0,1}$ is a drop due to the current obtained by adding currents I(1) to I(n), the voltage drop $V_{1,2}$ is a drop due to the current obtained by adding currents I(2) to I(n), and the voltage drop $V_{n-1,n}$ is a drop due to the current I(n), the voltage drop Vdrop is obtained as a function of n as in Equation 2:

$$V drop = \sum_{k=1}^{N} \frac{Ion(k)@Vset/2}{2} R + \sum_{k=2}^{n} \frac{Ion(k)@Vset/2}{2} R + \ldots + \sum_{k=n-1}^{N} \frac{Ion(k)@Vset/2}{2} R + Ion@Vset * R * n \approx \qquad \text{(Equation 2)}$$

$$\sum_{k=1}^{n} \frac{(n-k+1)Ion(k)@Vset/2}{2} R$$

Where, R is a resistance value between the cells of the word line WL. The reduction in on-current Ion@Vread is required in the read voltage Vread by the voltage drop Vdrop and actual on-current-voltage characteristics or an actual on-current-voltage model of the memory cell MC, and the optimal connection area, which compensates for the reduction in the on-current Ion@Vread, between the memory cell MCn and the word line WL is obtained. Finally, from these relationships, the connection area between the memory cell MCn and the word line WL is defined as a function of n.

According to the present embodiment, since the reduction of the on-current of the memory cell MC caused by the voltage drop Vdrop on the word line WL is to be compensated by the adjustment of the connection area between the word line WL and the memory cell MC, reliability of read operation is improved.

FIGS. 7 to 15 are views illustrating a manufacturing method of the semiconductor storage device according to the present embodiment. In FIGS. 7 to 15, the interlayer insulating film provided between the wirings and the like is again not illustrated for explanatory convenience.

Figure 7:
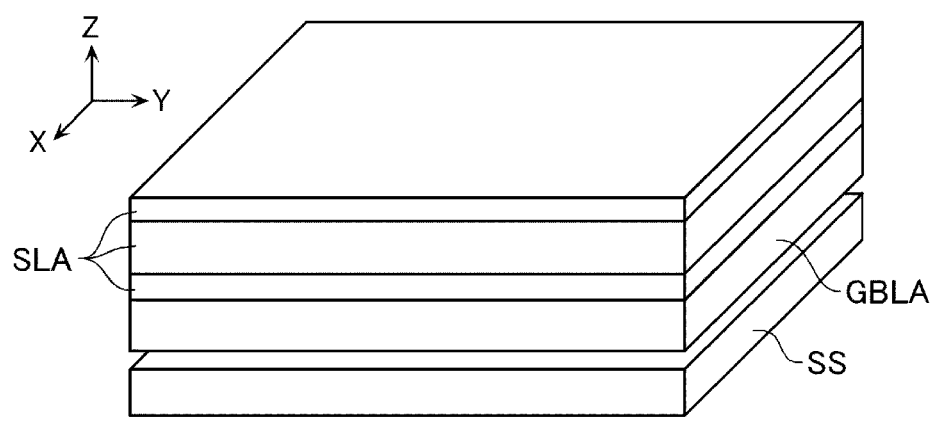
FIGS. 7 to 15 are perspective views illustrating a manufacturing method of the semiconductor storage device.

First, as illustrated in FIG. 7, a conductive layer GBLA for forming the global bit line GBL and the semiconductor layer SLA for forming the semiconductor layer SL are formed above a substrate SS. As the conductive layer GBLA and the semiconductor layer SLA, a conductive layer and an amorphous silicon layer, which are formed by a chemical vapor deposition (CVD) method or the like may be used. In addition, the semiconductor layer SLA may be formed using an amorphous silicon layer as a polysilicon layer by a rapid thermal anneal (RTA) method or the like.

Figure 8:
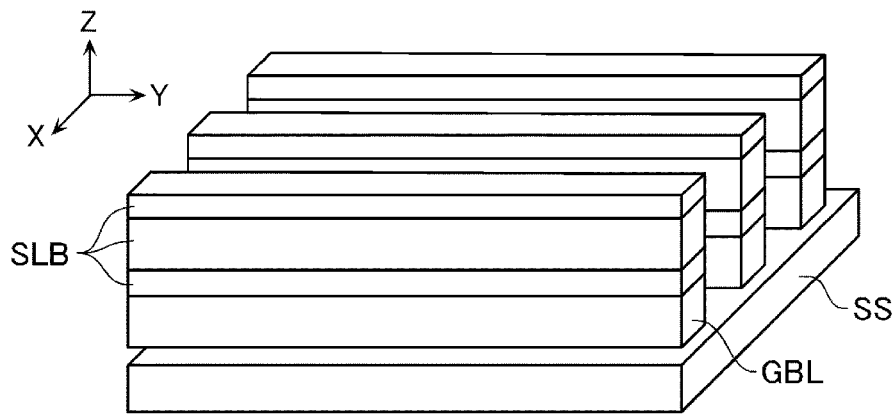

Next, the conductive layer GBLA and the semiconductor layer SLA are divided in the X direction as illustrated in FIG. 8. The step is performed by, for example, a reactive ion etching (RIE) method. The global bit line GBL and the semiconductor layer SLB which extend in the Y direction are formed in this step.

Figure 9:
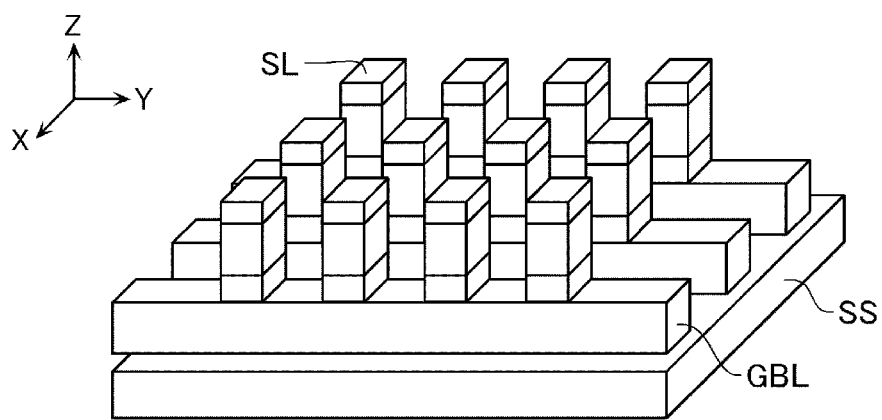

Next, the semiconductor layer SLB is divided in the Y direction as illustrated in FIG. 9. The step is performed by, for example, the RIE method or the like. The semiconductor layer SL is formed in this step.

Figure 10:
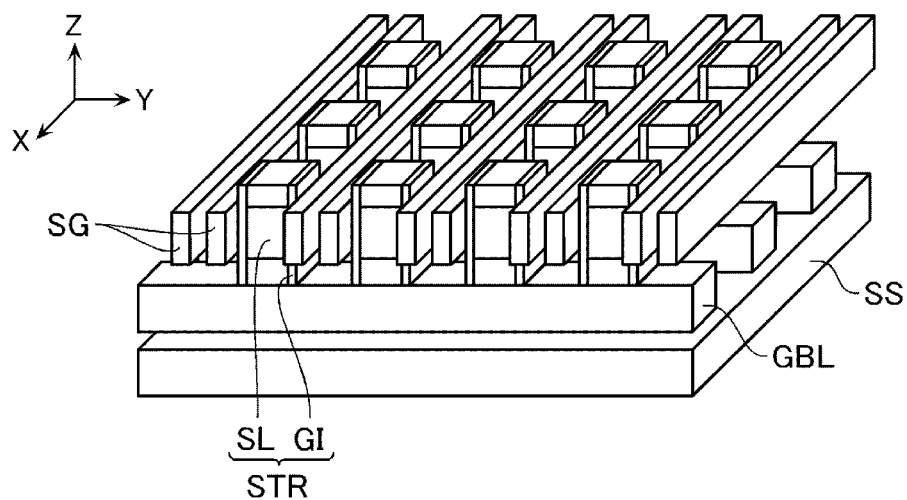

Next, as illustrated in FIG. 10, the gate insulating layer GI and a conductive layer are sequentially formed on the side surface of the semiconductor layer SL in the Y direction by the CVD method or the like. The conductive layer is divided in the Y direction to form the select gate line SG by the RIE method or the like. By doing so, the selection gate transistor STR is formed.

Figure 11:
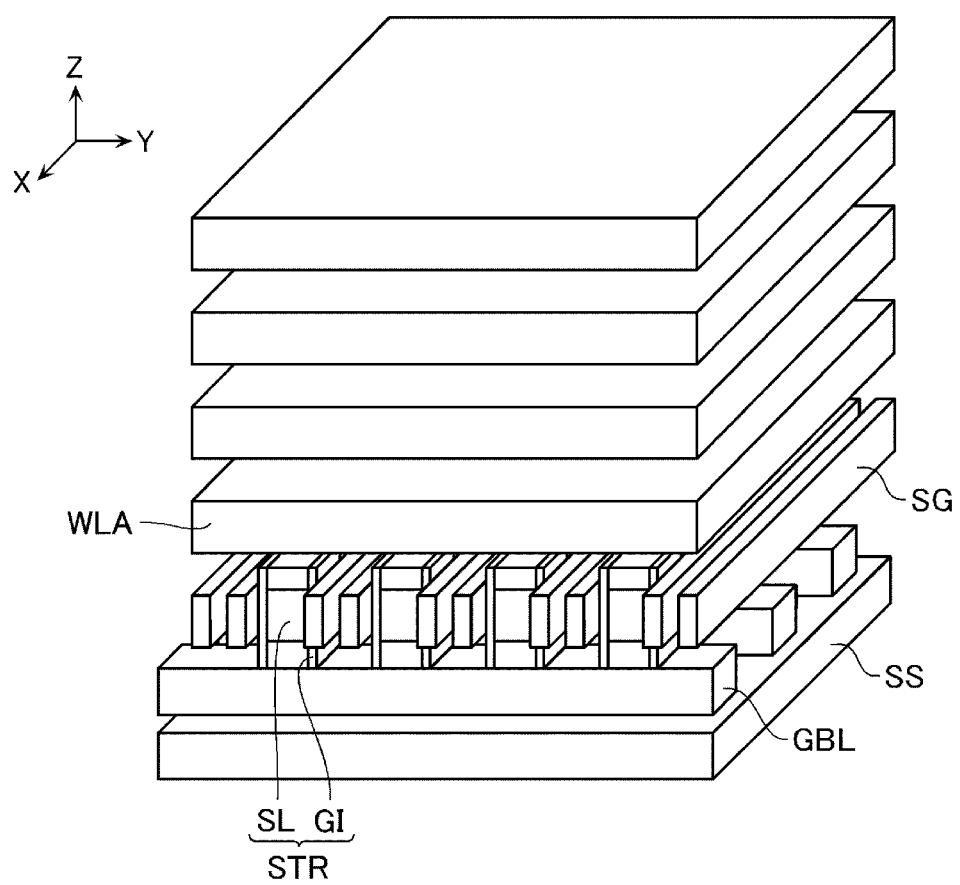

Next, as illustrated in FIG. 11, a plurality of the conductive layers WLA for forming the word line WL are stacked on the structure illustrated in FIG. 10. The step is performed by, for example, a CVD method or the like. The conductive layer WLA may be an amorphous silicon layer in which impurities are injected or a polycrystalline silicon layer.

Figure 12:
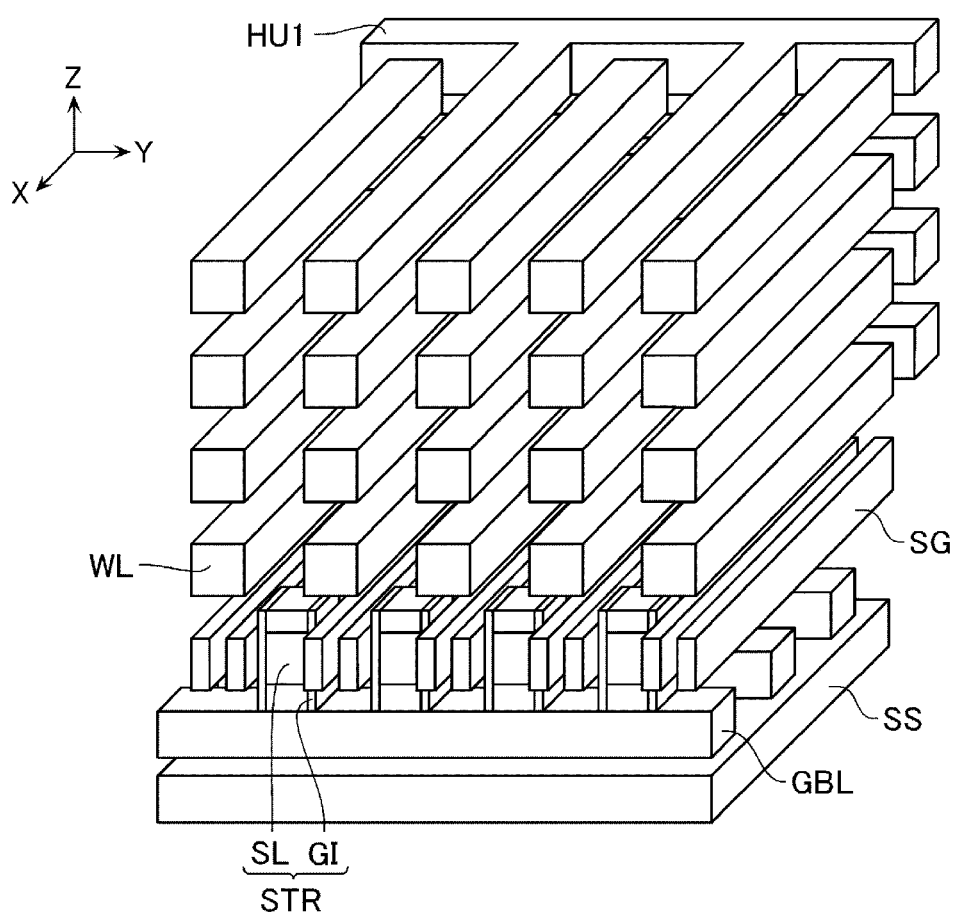

Next, as illustrated in FIG. 12, the plurality of the conductive layers WLA are processed into a comb shape to form word lines WL, and grooves are formed extending in the X direction and the Z direction to reach an upper surface of the selection gate transistor STR. The step is performed by, for example, the RIE method or the like.

Figure 13:
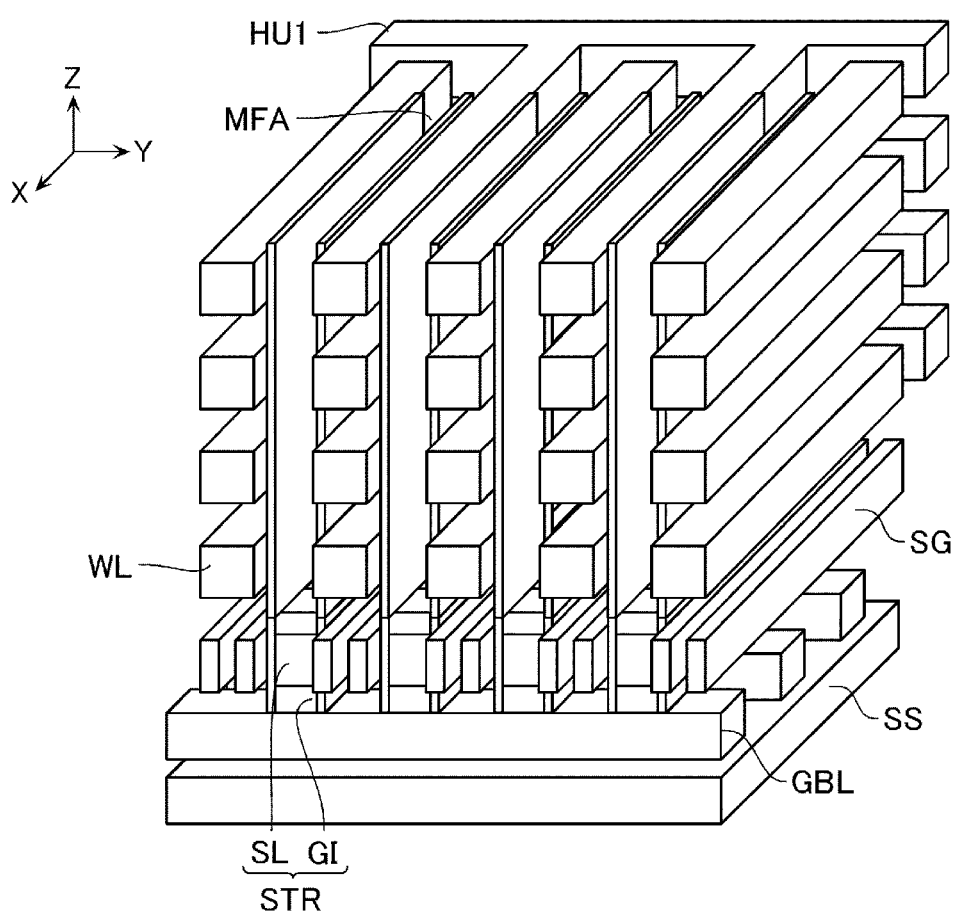

Next, as illustrated in FIG. 13, a resistance change film MFA, which is used as the memory film MF, is formed on a side surface of the groove between the plurality of the word lines WL in the Y direction. The step is performed by, for example, a CVD method or the like. A portion of the resistance change film MFA which is formed on an upper surface of the semiconductor layer SL is removed by the RIE method or the like.

Figure 14:
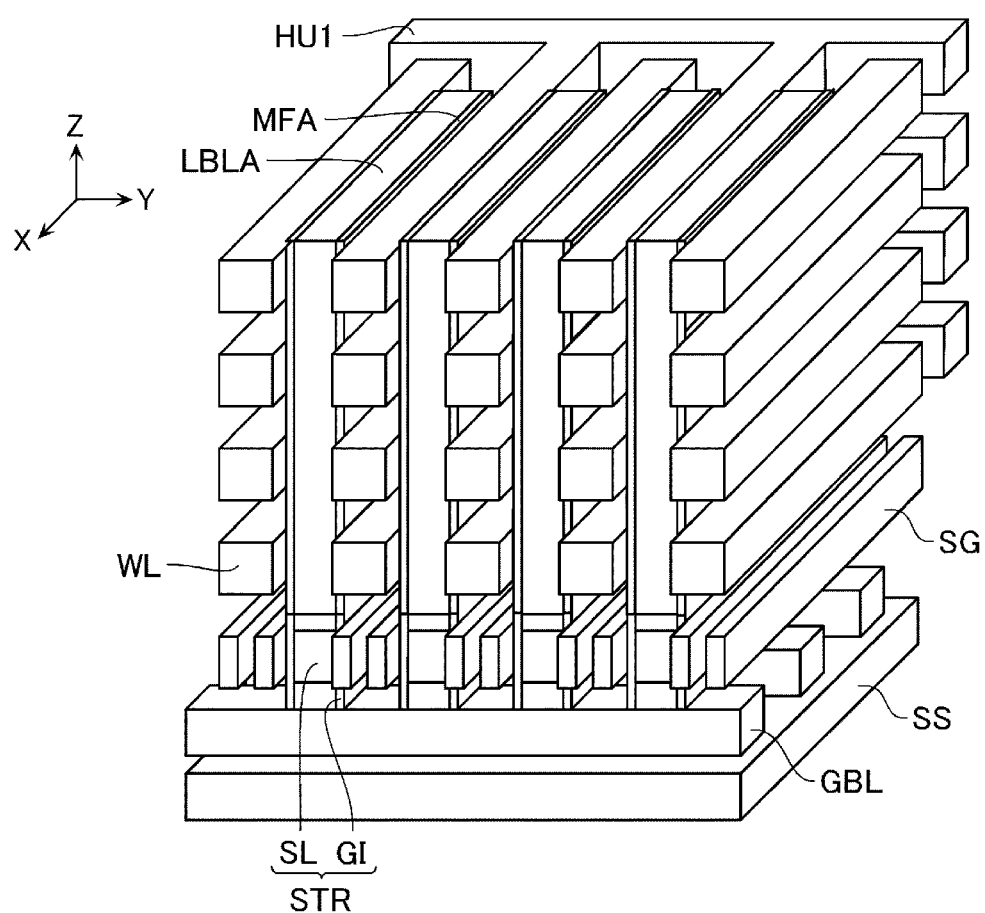

Next, as illustrated in FIG. 14, a conductive layer LBLA for forming the local bit line LBL is formed in the grooves between the resistance change films MFA. The step is performed by, for example, a CVD method or the like.

Figure 15:
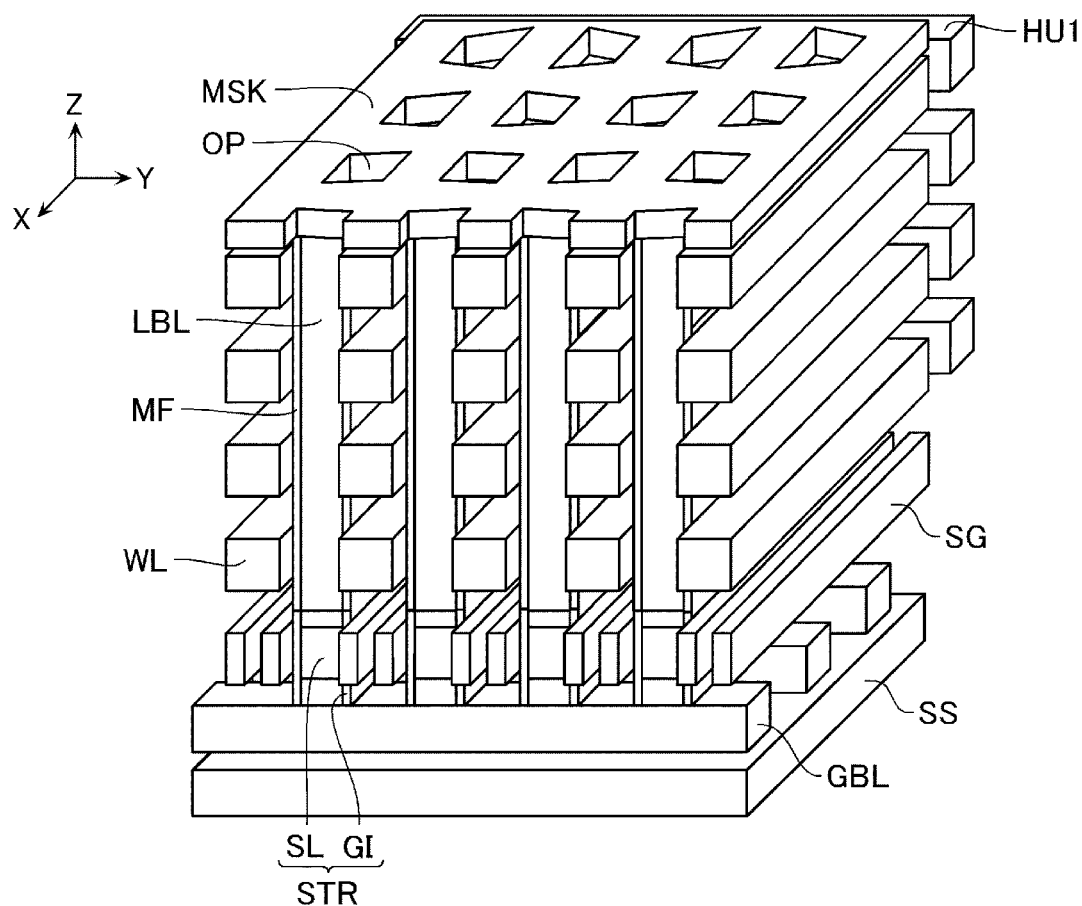

Next, as shown in FIG. 15, a mask MSK is formed on the structure illustrated in FIG. 14, the conductive layer LBLA and the resistance change film MFA are etched down to an upper surface of the global bit line GBL, and the conductive layer LBLA and the resistance change film MFA are thus divided in the X direction to form the local bit lines LBL and the memory films MF. The step is performed by, for example, the RIE method, or the like. A hole OP formed on the mask MSK has a trapezoidal shape corresponding to a gap between the stacked bodies LM as illustrated in FIG. 4. As a result, the stacked bodies LM can be formed in the various trapezoidal shapes as illustrated in FIG. 4.

In the above-described example, the resistance change film MFA and the conductive layer LBLA are formed and then etched to divide the local bit line LBL and the memory film MF in the X direction. However, the local bit line LBL extending in the X direction may be formed by forming an insulating layer in the groove between the word lines WL, forming the memory film MF on an inner wall of a hole portion formed by etched into the insulating layer, and forming the conductive layer in the memory film MF.

Second Embodiment

Figure 16:
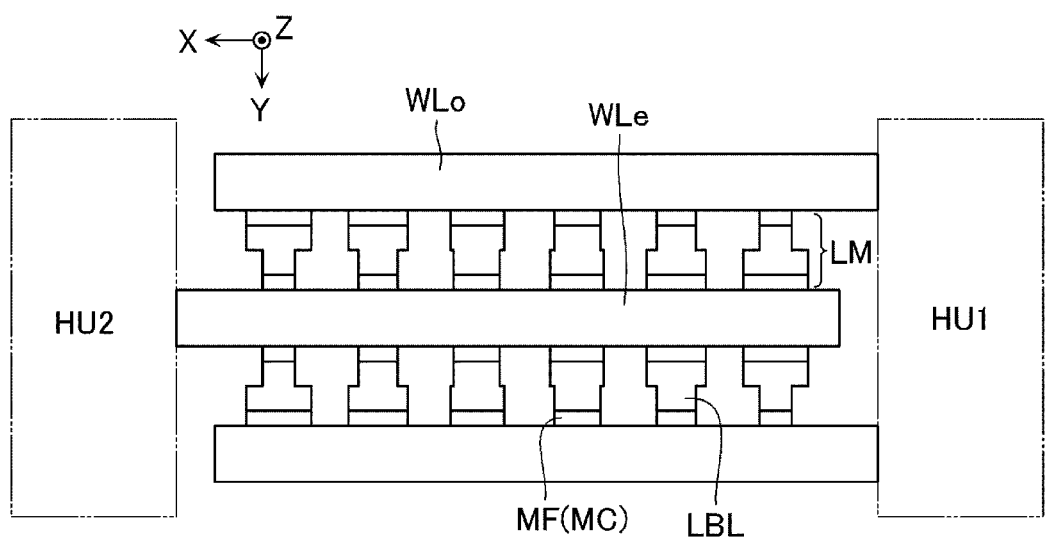
FIG. 16 is a plan view illustrating a memory cell array in a semiconductor storage device according to a second embodiment.

FIG. 16 is a plan view illustrating a configuration of a part of the semiconductor storage device according to a second embodiment.

In the second embodiment, the connection area between the odd-numbered word line WLo and the memory cells MC is increased as distance from the first hook-up portion HU1 increases and the connection area between the even-numbered word line WLe and the memory cells MC is increased as distance from the second hook-up portion HU2 increases, which is similar to the first embodiment. However, in the second embodiment, the stacked body LM formed of the local bit lines LBL and the memory films MF is formed in a stepwise "T" shape instead of a trapezoidal shape.

Third Embodiment

Figure 17:
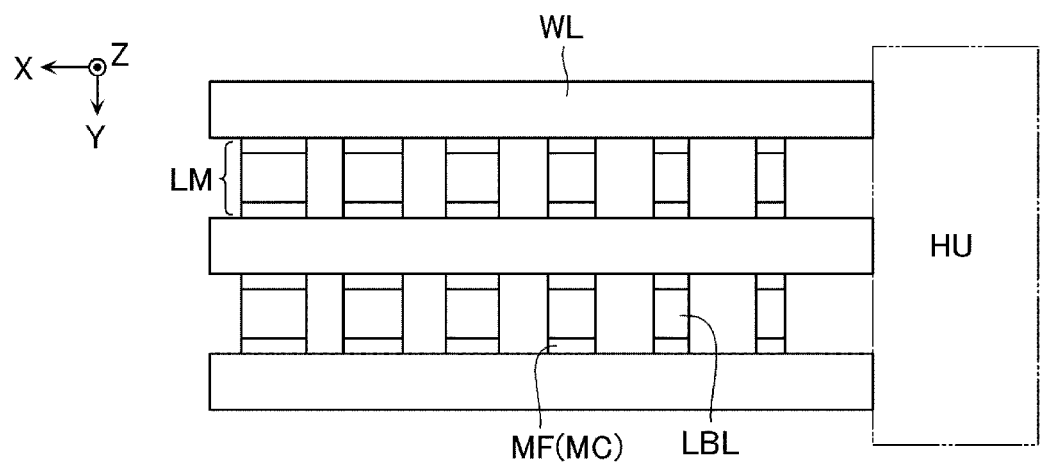
FIG. 17 is a plan view illustrating a memory cell array in a semiconductor storage device according to a third embodiment.

FIG. 17 is a plan view illustrating a configuration of a part of the semiconductor storage device according to a third embodiment.

In the third embodiment, the voltage is supplied from a hook-up portion HU in which all the word lines WL are connected rather than alternating connections of word lines WL to different hook-up portions (e.g., hook-up portion HU1 and hook-up portion HU2). In this third embodiment, a cross section is a rectangular shape when viewed in the Z direction of the laminate LM formed of the local bit line LBL and the memory film MF. In the third embodiment, the memory cells MC are arranged along the X direction at a fixed pitch. Therefore, a gap between adjacent memory cells MC in the X direction becomes larger the closer to the hook-up portion HU.

Fourth Embodiment

Figure 18:
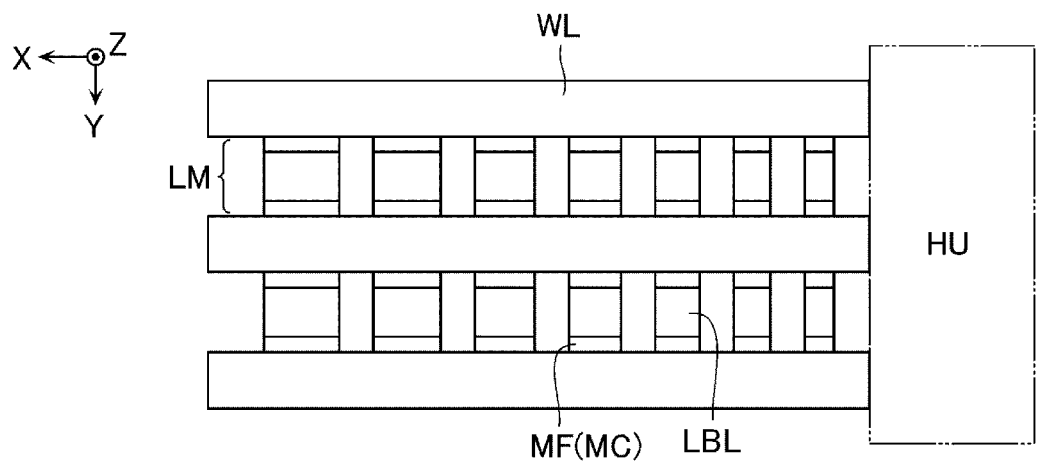
FIG. 18 is a plan view illustrating a memory cell array in a semiconductor storage device according to a fourth embodiment.

FIG. 18 is a plan view illustrating a configuration of a part of the semiconductor storage device according to a fourth embodiment.

In the fourth embodiment, the voltage is supplied from a hook-up portion HU to which all the word lines WL are connected, as in the third embodiment. Again, a cross section is a rectangular shape when viewed in the Z direction of the stacked body LM formed of the local bit line LBL and the memory film MF. However, in the fourth embodiment, the gap between adjacent memory cells MC in the X direction is kept constant. Therefore, the pitch of the memory cells MC along the X direction decreases the closer to the hook-up portion HU.

Fifth Embodiment

Figure 19:
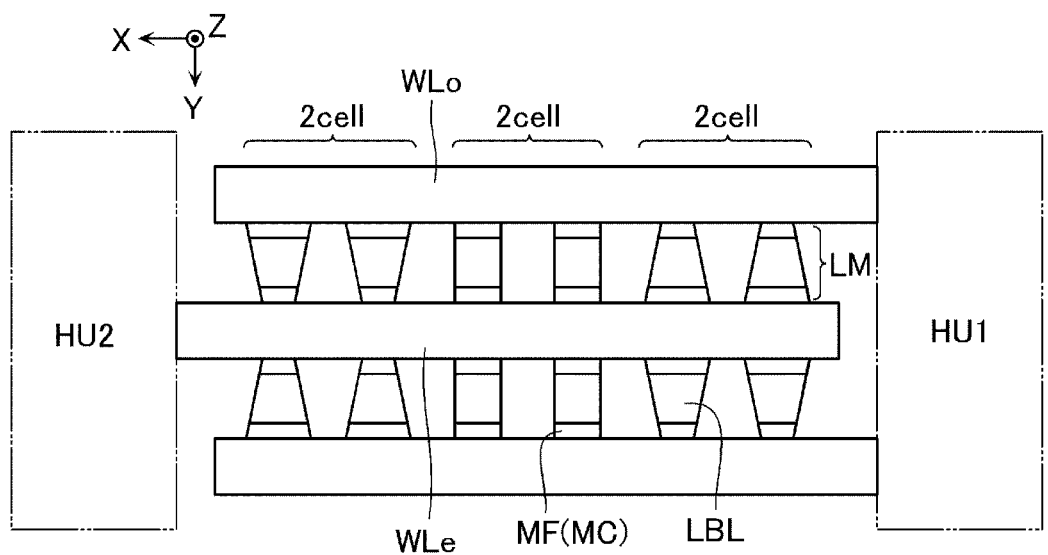
FIG. 19 is a plan view illustrating a memory cell array in a semiconductor storage device according to a fifth embodiment.

FIG. 19 is a plan view illustrating a configuration of a memory cell array in a semiconductor storage device according to a fifth embodiment.

In the fifth embodiment, the connection area between the word lines WL and the memory cells MC is increased for a subset of the memory cells MC closest to the hook-up portions HU1 or HU2. Here, the subset includes the two closest memory cells MC on each word line WL for each respective hook-up portion HU1 or HU2. The other memory cells MC which not one of the closest two to a hook-up portion HU1 or HU2 are kept constant dimension. Additionally, the two closest memory cells MC to each hook-up portion HU1 or HU2 have the same dimension.

Sixth Embodiment

Figure 20:
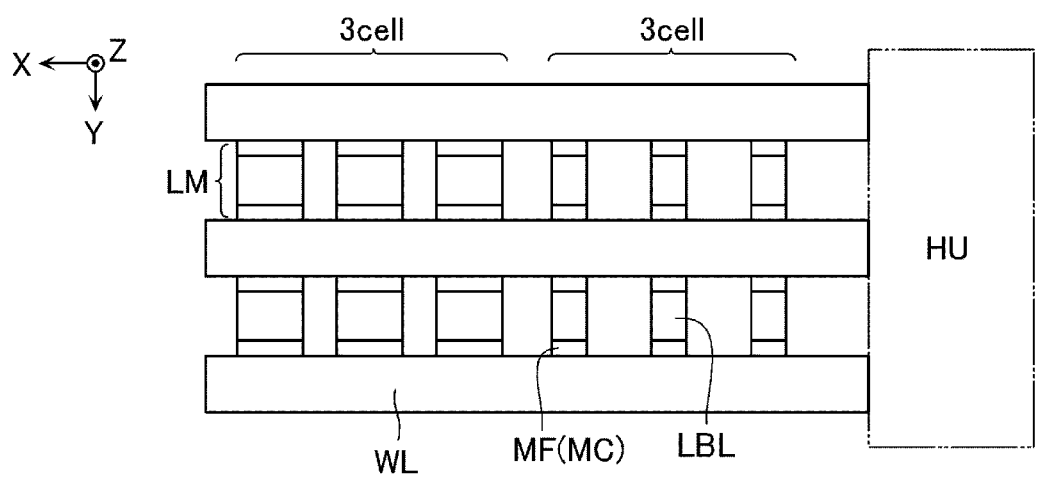
FIG. 20 is a plan view illustrating a memory cell array in a semiconductor storage device according to a sixth embodiment.

FIG. 20 is a plan view illustrating a configuration of a part of the semiconductor storage device according to a sixth embodiment.

In the sixth embodiment, the connection area between the word line WL and the memory cells MC do not change continuously with distance from the hook-up portion HU, rather a subset of the closest memory cells MC (in this case the three closest) to the hook-up portion HU each have the same connection area and the memory cells MC outside of the subset also have the same connection area (which different from the subset's connection area. In the sixth embodiment, the voltage is supplied from a single hook-up portion HU in which all the word lines WL are arranged on one side in the X direction.

While certain embodiments have been described, these embodiments have been presented by way of example only, and are not intended to limit the scope of the present disclosure. Indeed, the novel embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the inventions.

What is claimed is:

1. A semiconductor storage device, comprising:
a first wire extending in a first direction from a first end to a second end;
a plurality of second wires spaced from each other in the first direction and extending in a second direction intersecting the first direction; and
a plurality of memory films spaced from each other along the first wire from the first end to the second end and respectively being between the first wire and a second wire of the plurality of second wires, wherein
the plurality of memory films includes a first memory film and a second memory film, the first memory film being at position along the first wire that is between a position of the second memory film and the first end, and
a contact area between the second memory film and the first wire is greater than a contact area between the first memory film and the first wire.

2. The semiconductor storage device according to claim 1, wherein a voltage is applied from the first end of the first wire from a peripheral circuit, and the voltage is applied to the second end of the first wire via the first end of the first wire.

3. The semiconductor storage device according to claim 1, wherein the first end of the first wire is in a hookup region.

4. The semiconductor storage device according to claim 3, wherein the second end of the first wire is not in a hookup region.

5. The semiconductor storage device according to claim 1, wherein contact area between each of the plurality of memory films and the first wire increases with distance from the first end.

6. The semiconductor storage device according to claim 1, wherein contact area between a first subset of the plurality memory films nearer the first end than a remainder of the plurality of memory films not in the first subset is less than a contact area of a second subset of the plurality of the memory films in the remainder of the plurality of memory films, the second subset being nearer the second end of the first wire than any of the other memory films of the plurality of memory films.

7. The semiconductor storage device according to claim 1, wherein the plurality of memory films have a trapezoidal cross section between the first wire and the plurality of second wires.

8. The semiconductor storage device according to claim 1, wherein a width of each memory film in the plurality of memory films is different.

9. The semiconductor storage device according to claim 8, wherein a spacing distance in the first direction between adjacent memory films in the plurality of memory films is constant.

10. The semiconductor storage device according to claim 8, wherein a pitch of the plurality of memory films is constant along the first direction.

11. The semiconductor storage device according to claim 1, wherein a spacing distance in the first direction between adjacent memory films in the plurality of memory films is constant.

12. The semiconductor storage device according to claim 1, wherein a pitch of the plurality of memory films is constant along the first direction.

13. The semiconductor storage device according to claim 1, further comprising:
a third wire extending in parallel to the first wire with the plurality of second wires being between the first and third wires; and
a second plurality of memory films spaced from each other along the third wire, the second plurality of memory films respectively being between the third wire and a second wire of the plurality of second wires, wherein
the second plurality of memory films includes a third memory film and a fourth memory film, the third memory film being at a position along the third wire that is between a position of the fourth memory film and a first end of the third wire, and
a contact area between the fourth memory film and the third wire is greater than a contact area between the third memory film and the third wire, the first end of the third wire being opposite the second end of the first wire.

14. The semiconductor storage device according to claim 13, wherein each second wire has a trapezoidal cross-section.

15. The semiconductor storage device according to claim 13, wherein each second wire has a T-shaped cross-section.

16. A semiconductor storage device, comprising: a first wire extending in a first direction and having a first end in a first hookup region and a second end opposite the first end in the first direction; a second wire extending in a second direction intersecting the first direction; a third wire extending in the second direction and spaced from the second wire in the first direction; a first memory film between the first wire and the second wire at a first position along the first wire and having a first contact area; a second memory film between the first wire and the third wire at a second position along the first wire and having a second contact area greater than the first contact area, the first position being between the second position and the first end of the first wire in the first direction; a fourth wire extending in the first direction parallel to the first wire, the second and third wires being between the first and fourth wire in a third direction orthogonal to the first and second directions, a first end of the fourth wire being in a second hookup region separated from the first hookup region in the first direction; a third memory film between the fourth wire and the second wire at a third position along the fourth wire and having a third contact area; and a fourth memory film between the fourth wire and the third wire at a fourth position along the fourth wire and having a fourth contact area less than the third contact area, the fourth position being between the third position and the first end of the fourth wire in the first direction.

17. The semiconductor storage device according to claim 16, wherein the third contact area is greater than the first contact area and the fourth contact area is less than the second contact area.

18. The semiconductor storage device according to claim 16, wherein the second and third wire each have a trapezoidal cross-section.

19. A semiconductor storage device, comprising:
a first wire extending in a first direction from a hookup region to a second end;
a second wire extending in the first direction from the hookup region, the first and second wires being spaced from each other in a second direction intersecting the first direction;
a plurality of third wires extending in a third direction orthogonal to the first and second direction, the third wires being between the first and second wires in the second direction and spaced from one another along the first direction;
a plurality of first memory films respectively between the first wire and each third wire;
a plurality of second memory films respectively between the second wire and each third wire, wherein
a contact area of a first memory film on a third wire adjacent to the hookup region is less than a contact area of a first memory film on a third wire nearer the second end.

20. The semiconductor storage device according to claim 19, wherein contact areas of the plurality of first memory films and the plurality of second memory films increase with distance from the hookup region in the first direction.

* * * * *